United States Patent
Lyons et al.

(10) Patent No.: US 6,972,576 B1
(45) Date of Patent: Dec. 6, 2005

(54) ELECTRICAL CRITICAL DIMENSION MEASUREMENT AND DEFECT DETECTION FOR RETICLE FABRICATION

(75) Inventors: Christopher F. Lyons, Fremont, CA (US); Khoi A. Phan, San Jose, CA (US); Cyrus E. Tabery, Cupertino, CA (US); Bhanwar Singh, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 545 days.

(21) Appl. No.: 10/160,334

(22) Filed: May 31, 2002

(51) Int. Cl.[7] .............................................. G01R 27/08
(52) U.S. Cl. ........................ 324/699; 324/716; 438/10; 438/17
(58) Field of Search .............................. 324/699, 716, 324/158.1; 430/5; 438/5, 6, 10, 11, 14, 17, 438/18, 130

(56) References Cited

U.S. PATENT DOCUMENTS

| | | | |
|---|---|---|---|
| 4,809,341 A | 2/1989 | Matsui et al. ................. 382/8 |
| 4,926,489 A | 5/1990 | Danielson et al. ............ 382/8 |
| 4,927,692 A * | 5/1990 | Dhanakoti et al. ............ 430/5 |
| 5,240,796 A | 8/1993 | Lee et al. ...................... 430/5 |
| 5,390,420 A * | 2/1995 | Schultz ....................... 33/286 |
| 5,438,272 A * | 8/1995 | Craig et al. ................. 324/718 |
| 5,460,908 A | 10/1995 | Reinberg ...................... 430/5 |
| 5,789,120 A | 8/1998 | Jang et al. .................... 430/5 |
| 5,849,440 A | 12/1998 | Lucas et al. ................... 430/5 |
| 5,936,707 A | 8/1999 | Nguyen et al. ............... 355/18 |
| 6,027,859 A | 2/2000 | Dawson et al. ............ 430/312 |
| 6,136,479 A | 10/2000 | Yamaguchi ................... 430/5 |
| 6,183,915 B1 | 2/2001 | Rolfson ........................ 430/5 |
| 6,537,708 B2 * | 3/2003 | Chan ......................... 324/716 |

* cited by examiner

*Primary Examiner*—Anjan Deb
*Assistant Examiner*—Timothy J. Dole
(74) *Attorney, Agent, or Firm*—Amin & Turocy, LLP

(57) ABSTRACT

A system for testing a reticle used in semiconductor wafer fabrication is provided. The system includes a reticle that has an opaque metal layer over a translucent substrate. The reticle includes one or more test features containing probe points operable for electrical contact. The system includes a reticle test system that is capable of applying a voltage to the probe points, measuring the resulting current, calculating the corresponding resistance of the test features, and determining the critical dimensions of the test features. The system is also capable of determining defects based on the resistance measurements. The critical dimension information and defect information can then be used to refine the processes used in the fabrication of subsequent reticles.

25 Claims, 10 Drawing Sheets

ELECTRICAL CRITICAL DIMENSION MEASUREMENT AND DEFECT DETECTION FOR RETICLE FABRICATION

FIELD OF THE INVENTION

The present invention generally relates to semiconductor processing and, more particularly, to a system and method for facilitating the development of a reticle employed in semiconductor processing.

BACKGROUND OF THE INVENTION

In the semiconductor industry, there is a continuing trend toward higher device densities. To achieve these high densities there have been, and continue to be, efforts toward scaling down device dimensions (e.g., at sub-micron levels) on semiconductor wafers. In order to accomplish such high device packing densities, smaller and smaller feature sizes are required. This may include the width and spacing of interconnecting lines, spacing and diameter of contact holes, and the surface geometry, such as corners and edges, of various features. The dimensions of and between such small features can be referred to as critical dimensions.

The requirement of small features with close spacing between adjacent features requires high resolution photolithographic processes. In general, lithography refers to processes for pattern transfer between various media. It is a technique used for integrated circuit fabrication in which a silicon structure is coated uniformly with a radiation-sensitive film, the resist, and an exposing source (such as optical light, x-rays, or an electron beam) illuminates selected areas of the surface through an intervening master template, the reticle or photomask, for a particular pattern. The lithographic coating is generally a radiation-sensitive coating suitable for receiving a projected image of the subject pattern. Once the image is projected, it is indelibly formed in the coating. The projected image may be either a negative or a positive image of the subject pattern. Exposure of the coating through a reticle or photomask causes the image area to become either more or less soluble (depending on the coating) in a particular solvent developer. The more soluble areas are removed in the developing process to leave the pattern image in the coating as less soluble polymer.

The process of manufacturing semiconductors (e.g., integrated circuits, ICs, chips) employing reticles typically consists of more than a hundred steps, during which hundreds of copies of an integrated circuit may be formed on a single wafer. Generally, the process involves creating several patterned layers on and into the substrate that ultimately forms the complete integrated circuit. The patterned layers are created, in part, by the light that passes through the reticles. Thus, processing the positive or negative of the pattern into the reticle is important in fabricating the semiconductor.

Reticle manufacture can involve phases including depositing a photoresist on a reticle, exposing a pattern into the photoresist, post exposure baking, developing the pattern exposed into the photoresist, etching the photoresist and/or mask and stripping the resist.

Reducing critical dimensions, and reproducing more accurate critical dimensions facilitates achieving higher device densities. Conventional lithographic processes employed to produce such features depend, at least in part, on the quality of reticles employed in fabricating the integrated circuits. Thus, improvements in reticle fabrication quality are desired.

Visual inspection methods have been important in both the production and the development of reticles. For example, visually inspecting developed photoresist patterns from a dose-focus matrix is well-known in the art. While visual inspection techniques may be simple to implement, they are difficult to automate, and furthermore, have typically operated in isolation from other fabrication phases. Further, visual techniques employing scanning electron microscopes (SEM) and atomic force microscopes (AFM) can be expensive, time-consuming and/or destructive. Systems and methods capable of rapidly evaluating the critical dimensions of a reticle and the ability to rapidly inspect a reticle for defects can lead to significantly improved results and efficiencies in the manufacture on integrated circuits.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

A system and method are provided to determine critical dimensions and to detect defects in a reticle for semiconductor processing. In one embodiment, the system and method employ test structures for electrical resistance measurements of metal lines fabricated in the metal or opaque layer of a reticle. To avoid wasting space, test structures are located within the scribe lines between the multiple device feature areas of the reticle. The device feature area is the area of the reticle where the features of the integrated circuits are located. Multiple device feature areas are separated by scribe lines. When space allows, the test structure can be located within the actual device feature area. The test structures may also be located within both the scribe lines and within the actual device feature layout. The test structures contain test features constructed to replicate the critical dimensions of the device feature area. Test structures may contain test features of various lengths, widths, and shapes placed with various spacing between the test features.

A reticle test system allows a test head to apply a voltage across probe points located at each end of test features within the test structure or within the actual device feature layout. Resulting current measurements are used to calculate the resistance of a metal line from which the critical dimensions are determined. Electrical continuity measurements between probe points are used to determine defects within the reticle. Electrical continuity verifies a contiguous metal line exists. A test structure employing test features comprising opens and shorts is provided to measure device defects. A plurality of test structures may be spread throughout the actual device feature layout to measure defects throughout the reticle.

The resistance and electrical continuity results can be utilized to adjust parameters associated with the fabrication of the reticle. Actual results can be determined and compared with expected results to determine if the reticle fabrication processes are within acceptable limits and to adjust the parameters accordingly if the results are not within acceptable limits. Additionally, the measured results and adjusted parameters can provide feedback/feedforward information to alter the fabrication of subsequent reticles.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION OF THE INVENTION

Figure 1:
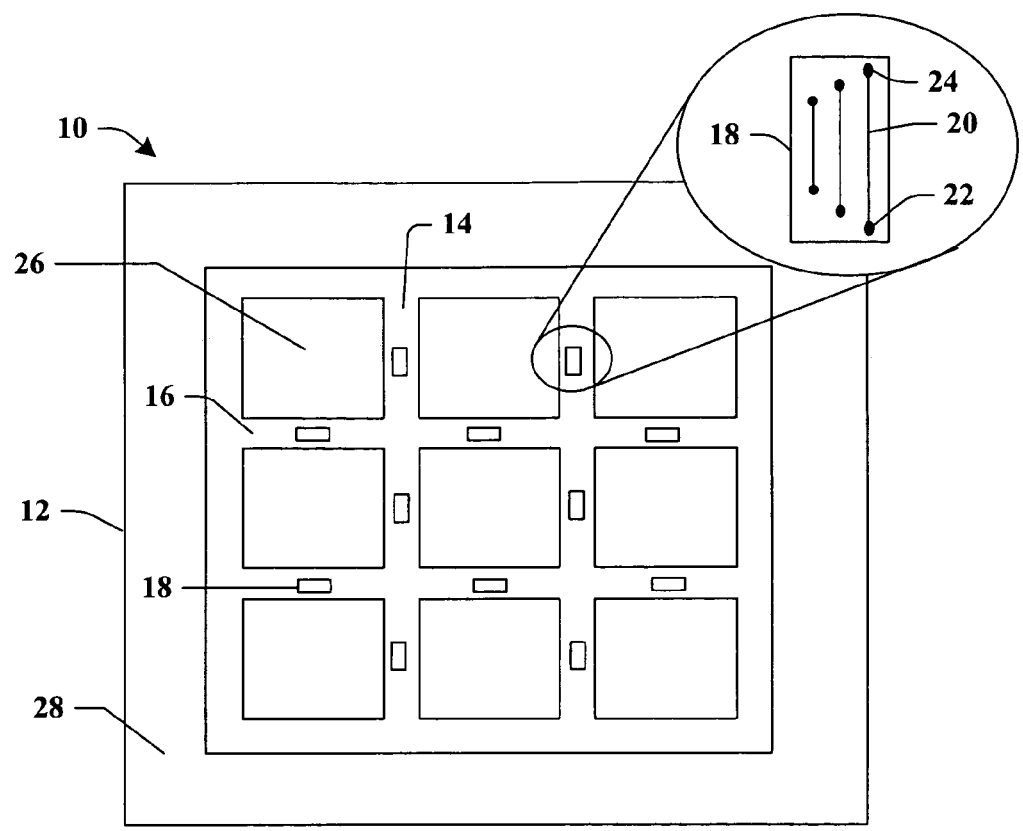
FIG. 1 is an illustration of a reticle with test structures located within the scribe lines in accordance with one aspect of the present invention.

The present invention will now be described with reference to the drawings wherein like reference numerals are used to refer to like elements throughout. The following detailed description is of the best mode presently contemplated by the inventors for practicing the invention. It should be understood that the description of these aspects are merely illustrative and that they should not be taken in a limiting sense.

FIG. 1 illustrates reticle 10 in accordance with one aspect of the present invention. In semiconductor integrated circuit fabrication, a reticle is used during the photolithography process to expose a resist layer coated on a wafer corresponding to the pattern formed on the reticle. The reticle 10 includes a plurality of device feature areas 26 which are used to expose a plurality of individual die or chips on a wafer or substrate. The device feature area is the area of the reticle where the features of the integrated circuits are located. Each device feature area 26 contains an identical pattern to be transferred to the wafer. Reticle 10 is illustrated as a brightfield reticle where patterned features to be transferred are opaque features on a clear background. However, it is to be understood that the principle and process of the invention may be applied to a darkfield reticle where the patterned features to be transferred are clear features on an opaque background. Reticle substrate 12 can be any number of types of transparent material such as silica glass, fused quartz, or any other material transparent to the radiation commonly used in semiconductor lithographic operations.

Overlying substrate 12 is an opaque metal layer 28. Metal layer 28 can be a composite material of chromium and gold, chromium and another metal, a homogeneous metal such as gold or other similar metals, or a combination of metals. Metal is used frequently throughout this application, but it is to be understood that any suitable metal or combination of metals may be used. Vertical lines and horizontal lines separate the device feature areas 26 from each other and form vertical scribe lines 14 and horizontal scribe lines 16 wherein the individual chips on the wafer may be cut. One or more test structures 18 are formed in the area of the scribe lines according to one aspect of the invention. A test structure is a collection of one or more test features. Test features are metal lines with at least two probe points, one located at either end of the line, operable for making electrical contact. The metal lines of the test feature may be designed as a contiguous line from one end to the other end (i.e., a short circuit, or short) or with a discontinuity between one end and the other end (i.e., an open circuit, or open). Within a test structure, test features of various lengths and widths can be used to replicate the critical dimensions of the device feature areas. The test structures may be located in the scribe lines when the device feature areas 26 are too dense to allow for test structures to be formed within the device feature areas.

Each test structure may contain one or more test features to replicate various critical dimensions. Test structure 18 contains a series of metal lines 20 of increasing length. In this example, test structures in the vertical scribe lines contain vertical metal lines and test structures in the horizontal scribe lines contain horizontal metal lines. Each metal line 20 within a test structure 18 contains a first probe point 22 and a second probe point 24. The first and second probe points are used to allow electrical contact to be made with each metal line 20. By applying an appropriate voltage to the probe points of each metal line, the resistance of each metal line can be calculated and used to determine critical dimensions.

Figure 2:
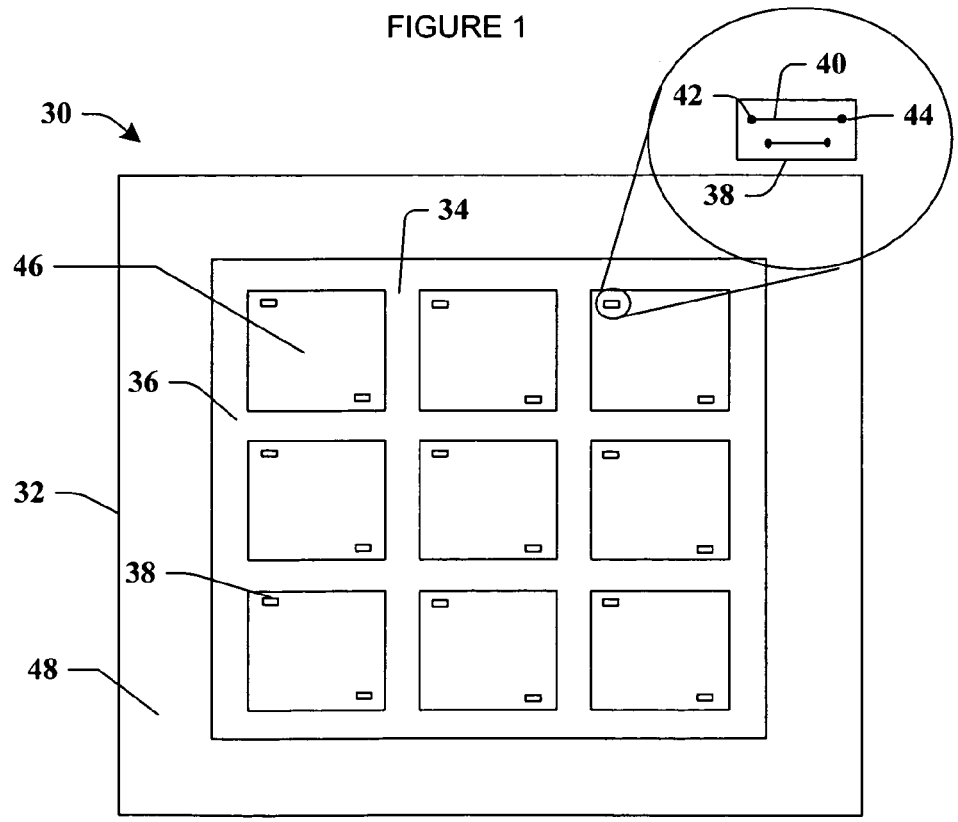
FIG. 2 is an illustration of a reticle with test structures located in the device feature areas in accordance with another aspect of the present invention.

FIG. 2 illustrates another aspect of the invention wherein test structures 38 are incorporated into the device feature areas 46 of the reticle. In FIG. 2, reticle 30 has substrate 32 and metal layer 48. Vertical scribe lines 34 and horizontal scribe lines 36 separate device feature areas 46 from each other. In reticle 30, no test structure is located within the vertical scribe lines 34 or the horizontal scribe lines 36. However, each device feature area 46 contains an identical set of two test structures 38, one each in opposite corners; the upper left hand corner and the lower right hand corner of the device feature area 46. Each test structure 38 contains two metal lines of different lengths. Each metal line 40 within a test structure 38 contains a first probe point 42 and a second probe point 44. The first and second probe points are used to allow electrical contact to be made with each metal line 40. By applying an appropriate voltage to the probe points of each metal line, the resistance of each metal line can be calculated and used to determine critical dimensions.

Figure 3:
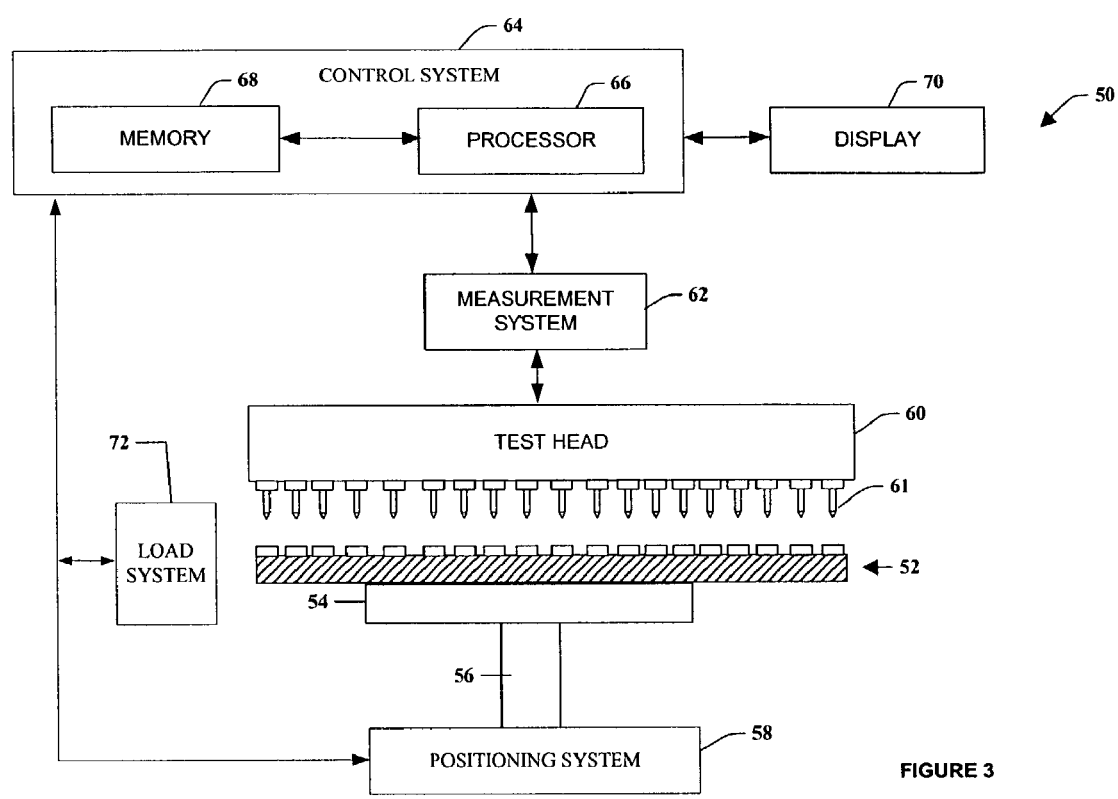
FIG. 3 is an illustration of a reticle test system utilized to determine critical dimensions and/or defects in a reticle in accordance with an aspect of the present invention.

FIG. 3 is a schematic illustration of a reticle test system 50 for carrying out an aspect of the present invention. In the system illustrated, a reticle 52 is mounted on a carrier fixture 54. Attached to the carrier is a spindle 56. A carrier positioning system 58 is operative coupled to the spindle 56. The carrier positioning system provides rotational and translational motion to the carrier allowing the reticle to be properly positioned below test head 60. The test head contains one or more probes 61 which are utilized to probe the probe points on the test features within the test structures or device feature areas of the reticle. The test head 60 applies a voltage to the probes 61, which in turn apply a voltage to the probe points of the test feature. A measurement system 62 checks the electrical continuity between appropriate probe points of the reticle and can determine the digital signature of the area under test. Electrical continuity exists when a complete path for current exists. By evaluating the response at various probe points to an applied voltage, defects in the reticle can be detected as described herein. The measurement system 62 can also measure the resultant current from a known applied voltage. From this information, the resistance of the test feature under test is determined. This resistance data is then used to determine the critical dimensions of the test feature under test.

The system 50 includes a control system 64 and a display system 70. The control system contains a processor 66 and a memory 68. The processor 66 may be any one of a plurality of processors suitable for carrying out the present invention. The processor is operatively coupled to the memory system 68, the measurement system 62, a load system 72, and the carrier positioning system 58. The processor 66 receives the output of the measurement system 62 and compares the results to the expected results stored in memory 68. The processor also determines the appropriate time and position that the reticle should be placed under the test head and provides an appropriate input to the positioning system. The positioning system moves the reticle at appropriate times to allow for additional measurements to be completed.

The memory 68 stores expected results data which is supplied to the processor 66. The memory 68 also serves to store program code which is executed by the processor 66 for carrying out the functions of the system. The memory also serves as a storage medium for temporarily storing information such as applied voltage, current measurements, resistance, carrier location, active probe points, and other data which may be necessary for carrying out the invention. An optional load system 72 provides the ability to rapidly load and unload a plurality of reticles onto the carrier in succession. As testing is completed on one reticle, the load system removes that reticle and loads the next one in succession for test.

FIGS. 4–14 illustrate how open circuits and short circuits are employed according to another aspect of the invention. A short is a short circuit which is implemented as a contiguous conductive line segment with probe points located at each end of the conductive line. An open is an open circuit which is implemented as a conductive line segment with a discontinuity located between the probe points which are located at each end of the conductive line. A discontinuity is a break in a conductive line segment that interrupts the contiguous nature of the line. A discontinuity causes an incomplete path for current to exist.

Figure 4:
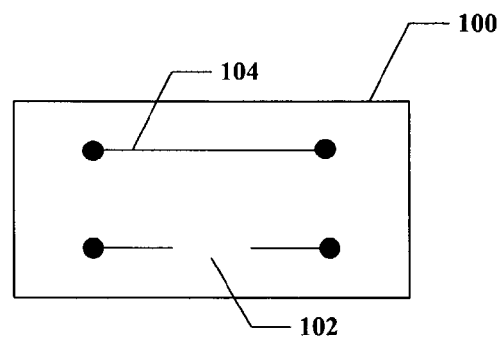
FIG. 4 is an illustration of a test structure containing two adjacent lines, one open and one short, that may be utilized to create a digital signature in accordance with an aspect of the present invention.

FIG. 4 illustrates a test structure 100 which contains an open 102, and a short 104. Through use of opens and shorts, it is possible to rapidly determine the existence of defects in the reticle. A short circuit is used to represent a digital 1, ("1") and an open circuit is used to represent a digital 0, ("0").

Figure 5:
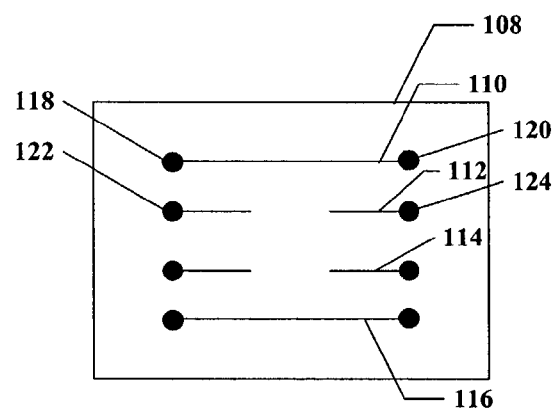
FIG. 5 is an illustration of a test structure containing four adjacent lines, two opens and two shorts, that may be utilized to create a digital signature and to determine critical dimensions and/or defects in a reticle in accordance with an aspect of the present invention.

FIG. 5 illustrates how opens and shorts can be used to create a test structure that defines a digital bit pattern of "1001". Test structure 108 contains short 110, open 112, second open 114, and second short 116. Through use of the reticle test system, probe points 118 and 120 are probed and the short circuit is detected and properly interpreted as a digital "1". Similarly, when the reticle test system probes the probe points 122 and 124, an open circuit is detected and properly interpreted as a digital "0". In similar fashion, line 114 is interpreted as a "0" and line 116 is interpreted as a "1". Therefore, the proper digital representation of the test structure in FIG. 5 is "1001". Such digital representations are referred to as the digital signature of the test structure.

The reticle test system can be used to probe a test structure and rapidly examine its digital signature. If a short circuit has a defect which breaks the contiguous nature of the line, then it is interpreted as a "0" instead of a "1". This is illustrated in FIG. 6.

Figure 6:
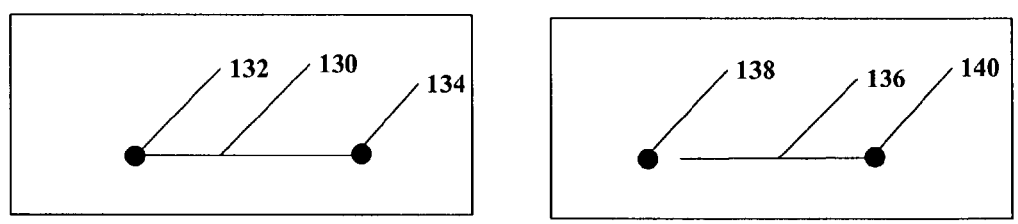
FIG. 6 is an illustration of a test structure containing a short with a defect which can be determined in accordance with an aspect of the present invention.

In FIG. 6, both line 130 and line 136 are designed to be short circuits which, if properly formed, are interpreted as "0"s by the reticle test system. When the reticle test system tests for electrical continuity between probes points 132 and 134, a short circuit or "1" is properly determined for line 130. However, line 136 contains a defect which breaks the line 136 near probe point 138. This can be caused from a processing problem known as foreshortening of the line. The fact that a defect has occurred is determined when the reticle test system tests for electrical continuity between probe points 138 and 140. In this case the reticle test system detects a "0" when it is expecting to detect a "1". In this manner, the foreshortening defect is detected.

Similarly, a test feature may be purposely designed as a short like line 136 where the discontinuity is positioned in close proximity to probe point 138. In one embodiment, close proximity positioning is about 0.1 microns or more and about 10 microns or less. In another embodiment, the close proximity positioning is about 0.2 microns or more and about 5 microns or less. A test feature such as line 136 may be used to verify that the line does not extend in length in such a manner as to complete a connection to probe point 138. In this case the reticle test system detects a "1" when it is expecting to detect a "0".

Figure 7:
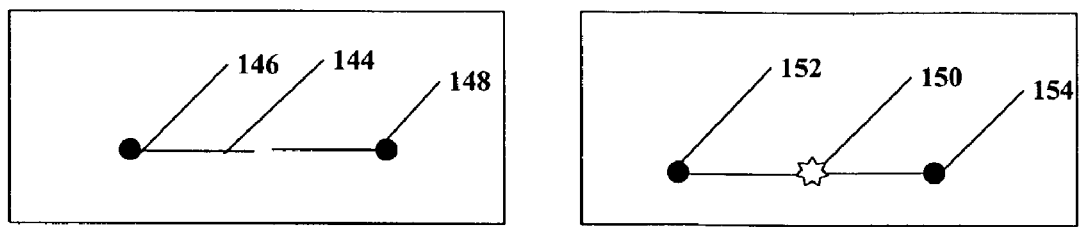
FIG. 7 is an illustration of a test structure containing an open with a defect which can be determined in accordance with an aspect of the present invention.

In FIG. 7, both lines 144 and 150 are designed to be open circuits which, if properly formed, are interpreted as "0"s by the reticle test system. When the reticle test system tests for electrical continuity between points 146 and 148, an open, or "0" is properly determined for line 144. However, line 150 has a defect in it in which metal bridges the area intended to be open. As a result, when the reticle test system tests for electrical continuity between points 152 and 154, a short, or "1" is determined for line 150. In this manner, a defect that bridges the two halves of an open is detected.

Figure 8:
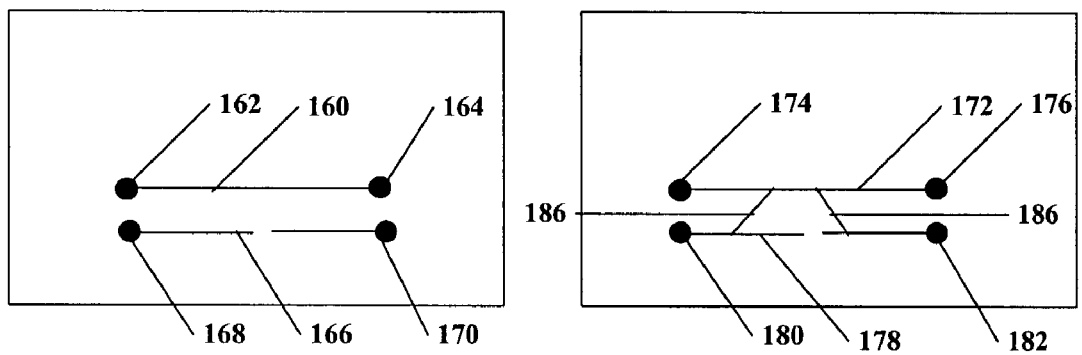
FIG. 8 is an illustration of a test structure containing metal lines which can be utilized to determine bridging defects between adjacent lines in accordance with an aspect of the present invention.

FIG. 8 illustrates yet another test structure in accordance with an aspect of the invention. The test structure in FIG. 8 can be utilized to look for bridging between closely spaced lines. Lines 160 and 166 are spaced to be representative of the closest line spacing utilized on the reticle. In one embodiment, the spacing is about 0.1 microns, or more and about 10 microns or less. In another embodiment, the spacing is about 0.2 microns, or more and about 5 microns or less. Lines 172 and 178 are similarly placed. A reticle test system which tests for electrical continuity between probe points 162 and 164 properly determines a "1" and between probe points 168 and 170 properly determines a "0". This is indicative that line 160 is a proper short, that line 166 is a proper open and that no bridging exists between the two lines. However, if one examines lines 172 and 178, one observes that a bridging defect 186 exists in two locations between the lines. A reticle test system now properly measures electrical continuity between probe points 174 and 176 and interprets a "1". However, when electrical continuity is checked between probe points 180 and 182, unexpected electrical continuity is detected and interpreted as a "1" instead of a "0". The reticle test system can also be configured to detect the unexpected electrical continuity that exists between probe point 180 to probe points 174 and 176 and between probe point 182 to probe points 174 and 176. The reticle test system detects the presence of the bridging while testing line 172 as electrical continuity is detected at probe points 180 and 182 while testing between probe points 174 and 176. It should be understood that this same arrangement detects the bridging in a similar fashion even if the bridging exists in only one of the two locations illustrated. Therefore, this type of test structure is utilized to check for bridging between closely spaced lines.

Figure 9:
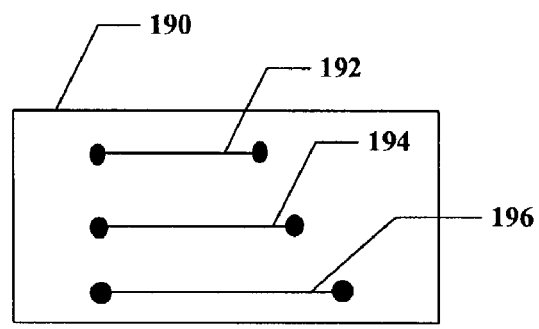
FIG. 9 is an illustration of a test structure containing progressively longer metal line shorts which can be utilized to determine critical dimensions and/or defects in a reticle in accordance with an aspect of the present invention.

FIGS. 9–13 illustrate a few additional test structures that can be employed to test for various defects and/or critical dimensions. FIG. 9 illustrates a test structure 190 which contains a series of shorts of increasing length. Based on the actual device features, line 192 is representative of a line of minimum length; line 194 is representative of an average length line; and line 196 is representative of a line of maximum length. The reticle test system can be used to probe the probe points and determine a test structure signature or pattern of "111". The reticle test system can determine whether any opens exists between the lines or whether any bridging exists between the individual lines. Additionally, since the applied voltage is know, by measuring the resultant current, the resistance of each line can be calculated. From the resulting resistance values, the critical dimensions of the lines are individually determined.

Figure 10:
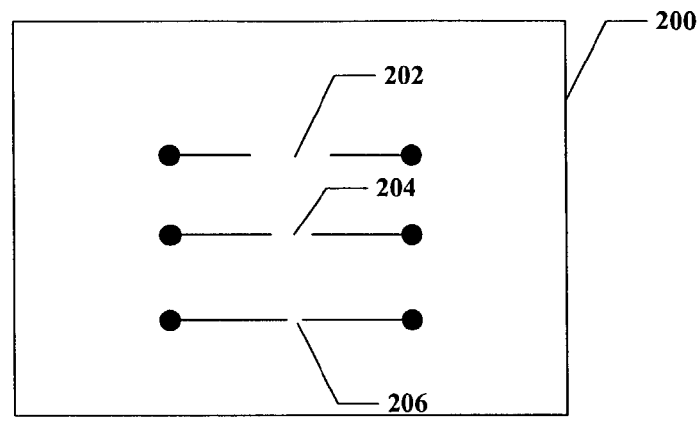
FIG. 10 is an illustration of a test structure containing opens with progressively shorter discontinuities in the metal lines which can be utilized to determine critical dimensions and/or defects in a reticle in accordance with an aspect of the present invention.

FIG. 10 illustrates test structure 200 which contains a series of opens in which the size of the opening in the line is progressively smaller. The opening in line 204 is reduced by about 50% or more from the opening in line 202. Similarly, the opening in line 206 is reduced by about 50% or more from the opening in line 204. This test structure can be used evaluate the ability to produce opens of various lengths. A reticle test system properly interprets this test structure signature as "000". The reticle test system determines whether any bridging exists between the respective halves of each line or between the individual lines.

Figure 11:
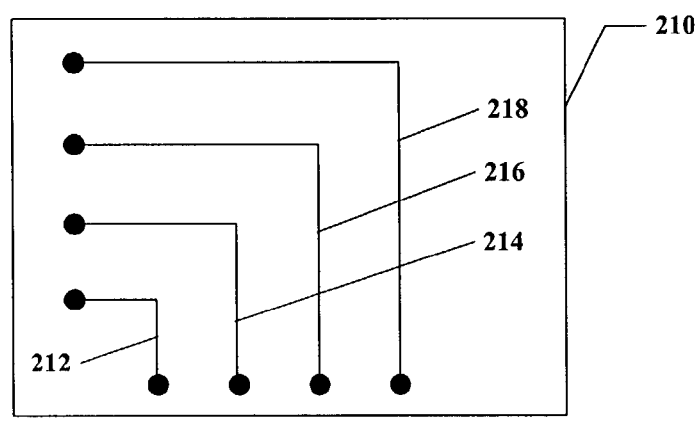
FIG. 11 is an illustration of a test structure containing progressively longer adjacent metal lines with 90 degree corners which can be utilized to determine critical dimensions and/or defects in a reticle in accordance with an aspect of the present invention.

FIG. 11 illustrates test structure 210 which contains a series of "L" shaped lines. Four progressively longer lines 212, 214, 216, and 218 are evenly spaced at an interval representative of the line spacing employed in the device feature area of a reticle. This test structure is used to look for defects in closely spaced lines containing 90 degree corners. Rounding of the corners on 90 degree corners can sometimes result in opens. This structure has a test signature of "1111" since all lines are shorts. Again, a reticle test system determines whether an open exists or whether any bridging exists between lines. Additionally, since the applied voltage is know, by measuring the resultant current, the resistance of each line can be calculated. From the resulting resistance values, the critical dimensions of the metal lines are individually determined.

Figure 12:
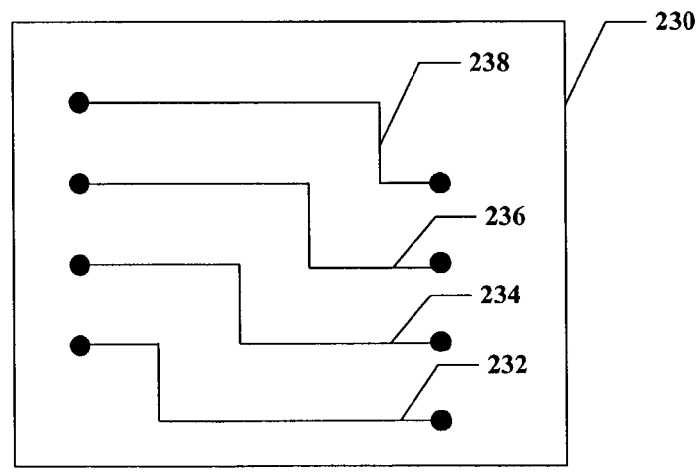
FIG. 12 is an illustration of a test structure containing progressively longer adjacent metal lines with multiple 90 degree corners which can be utilized to determine critical dimensions and/or defects in a reticle in accordance with an aspect of the present invention.

In FIG. 12, metal lines 232, 234, 236 and 238 in test structure 230 each contain two 90 degree turns in opposite directions. This test structure can also be used to look for defects in closely spaced 90 degree turns in metal lines. Rounding of the corners on 90 degree turns can sometimes result in opens. This structure has a test signature of "1111" since all lines are shorts. Again, a reticle test system determines whether an open exists or whether any bridging exists between lines. Additionally, since the applied voltage is know, by measuring the resultant current, the resistance of each line can be calculated. From the resulting resistance values, the critical dimensions of the metal lines are individually determined.

Figure 13:
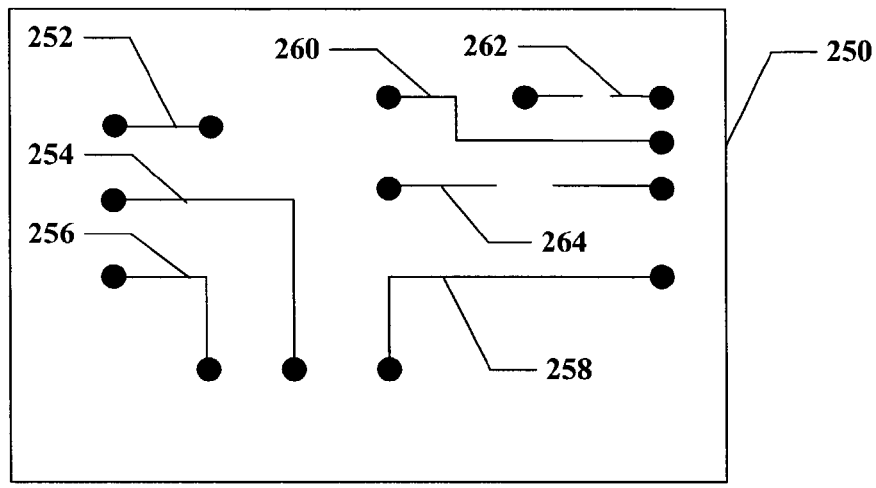
FIG. 13 is an illustration of a test structure containing a variety of metal lines which can be utilized to determine critical dimensions and/or defects in a reticle in accordance with an aspect of the present invention.

FIG. 13 illustrates a test structure in which a variety metal line sizes, shapes, spacing, opens and shorts are employed. A structure such as this is utilized to test for a variety of different defects and/or critical dimensions. It is to be understood that a test structure can be created containing any number of sizes, shapes and spacing so as to test for a variety of defects that are likely to occur in the device feature areas. This structure contains a straight metal line 252, metal lines with 90 degree corners 254, 256 and 258, a line with 90 degree turns in opposite directions 260, and opens 262 and 264 of different lengths. Through use of the reticle test system, the applied voltage is known and by measuring the resultant current, the resistance of each line can be calculated. From the resulting resistance values, the critical dimensions of the metal lines are individually determined.

Figure 14:
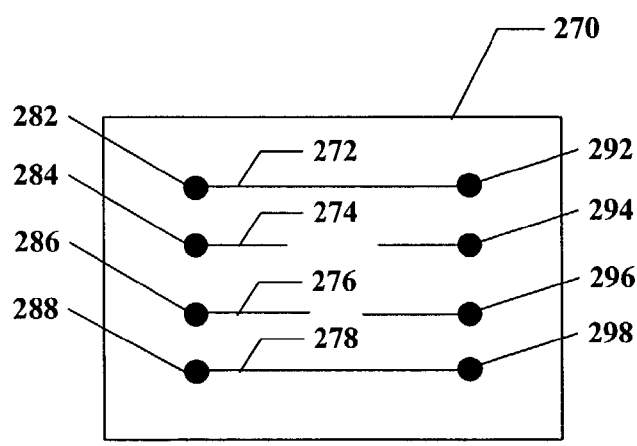
FIG. 14 is an illustration of a test structure containing four adjacent lines, two opens and two shorts, that may be utilized to create a digital signature and to determine critical dimensions and/or defects in a reticle in accordance with an aspect of the present invention.

The above examples illustrate merely a few of the ways in which the test structures can be utilized to help determine defects. It is to be understood that the present invention encompasses not only those illustrated, but also other variations and combinations that achieve a similar purpose. A simple test structure 270 is shown in FIG. 14. In test structure 270, four test features, a short 272, an open 274, a second open 276, and a second short 278, are employed. Short 272 has probe points 282 and 292; open 274 has probe points 284 and 294; open 276 has probe points 286 and 296; and short 278 has probe points 288 and 298. A reticle test system which measures electrical continuity at the probe points interprets a proper test structure as having a "1001" signature. This test structure is utilized to check for various defects. Additionally, since the applied voltage is know, by measuring the resultant current, the resistance of each line can be calculated. From the resulting resistance values, the critical dimensions of the metal lines are individually determined.

Figure 15:
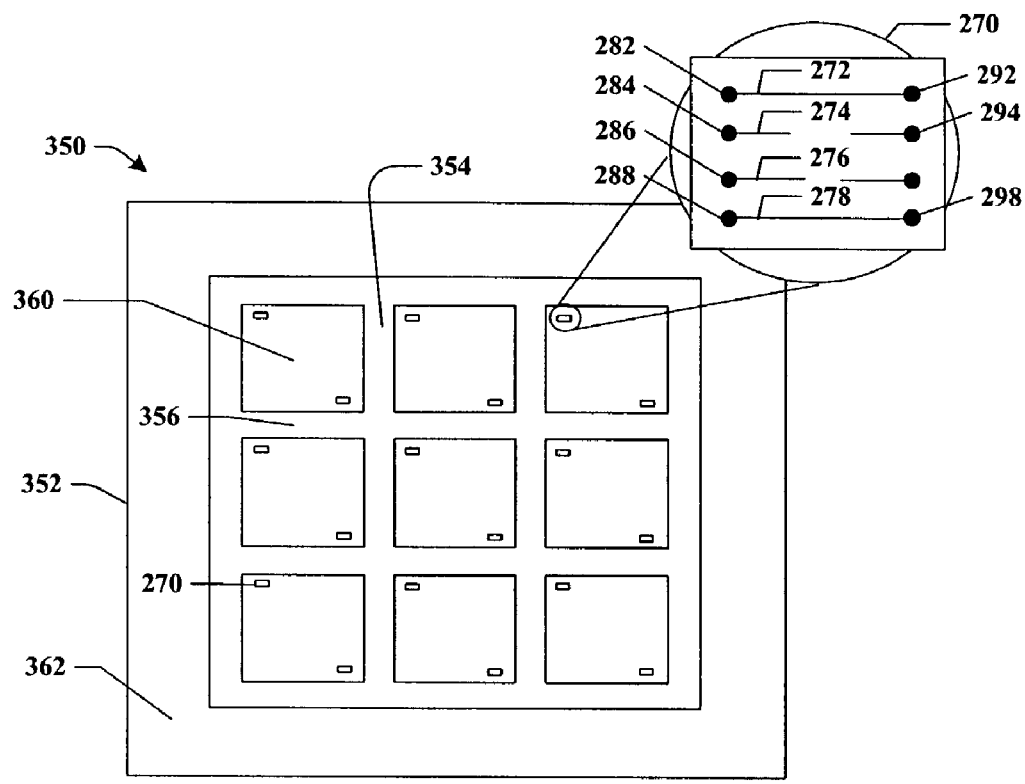
FIG. 15 is an illustration of a reticle with test structures located within the actual device feature areas in accordance with an aspect of the present invention.

FIG. 15 illustrates another aspect of the invention wherein test structures 270 are incorporated into the device feature areas 360 for the semiconductor chips. In FIG. 15, the contents of test structure 270 is identical to that described in FIG. 14. In FIG. 15, reticle 350 has substrate 352 and metal layer 362. Vertical scribe line 354 and horizontal scribe lines 356 separate device feature areas 360 from each other. In reticle 350, no test structure is located within the vertical scribe lines 354 or the horizontal scribe lines 356. However, each device feature area 360 contains an identical test structure 270. Through use of the reticle test system, the applied voltage is known. By measuring the resultant current, the resistance of each line can be calculated. From the resulting resistance values, the critical dimensions of the metal lines are individually determined.

Figure 16:
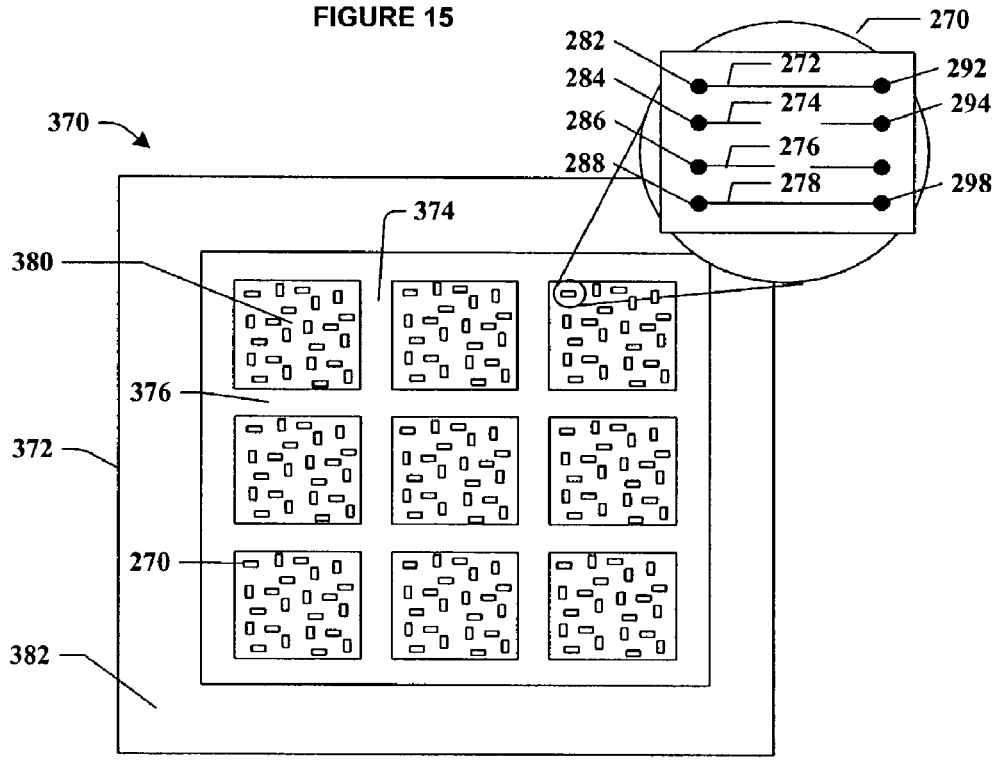
FIG. 16 is an illustration of a reticle with a plurality of test structures located within the actual device feature areas in accordance with an aspect of the present invention.

FIG. 16 illustrates a plurality of test structures 270 scattered through out the device feature areas 380 in accordance with one aspect of the invention. In FIG. 16, the contents of test structure 270 is identical to that described in FIG. 14. In FIG. 16, reticle 370 has substrate 372 and metal layer 382. Vertical scribe line 374 and horizontal scribe lines 376 separate device feature areas 380 from each other. In reticle 370, no test structure is located within the vertical scribe lines 374 or the horizontal scribe lines 376. However, each device feature area 380 contains a plurality of test structures 270 scattered throughout space available in the device feature areas 380. Through use of the reticle test system, the applied voltage is known. By measuring the resultant current, the resistance of each line can be calculated. From the resulting resistance values, the critical dimensions of the metal lines are individually determined. In this example, each test structure is the same. However, it is to be understood that a variety of different test structures may be used depending on the space available at any given location within the device feature areas. Each test structure could, in fact, be different and could be designed to test for different defects.

Figure 17:
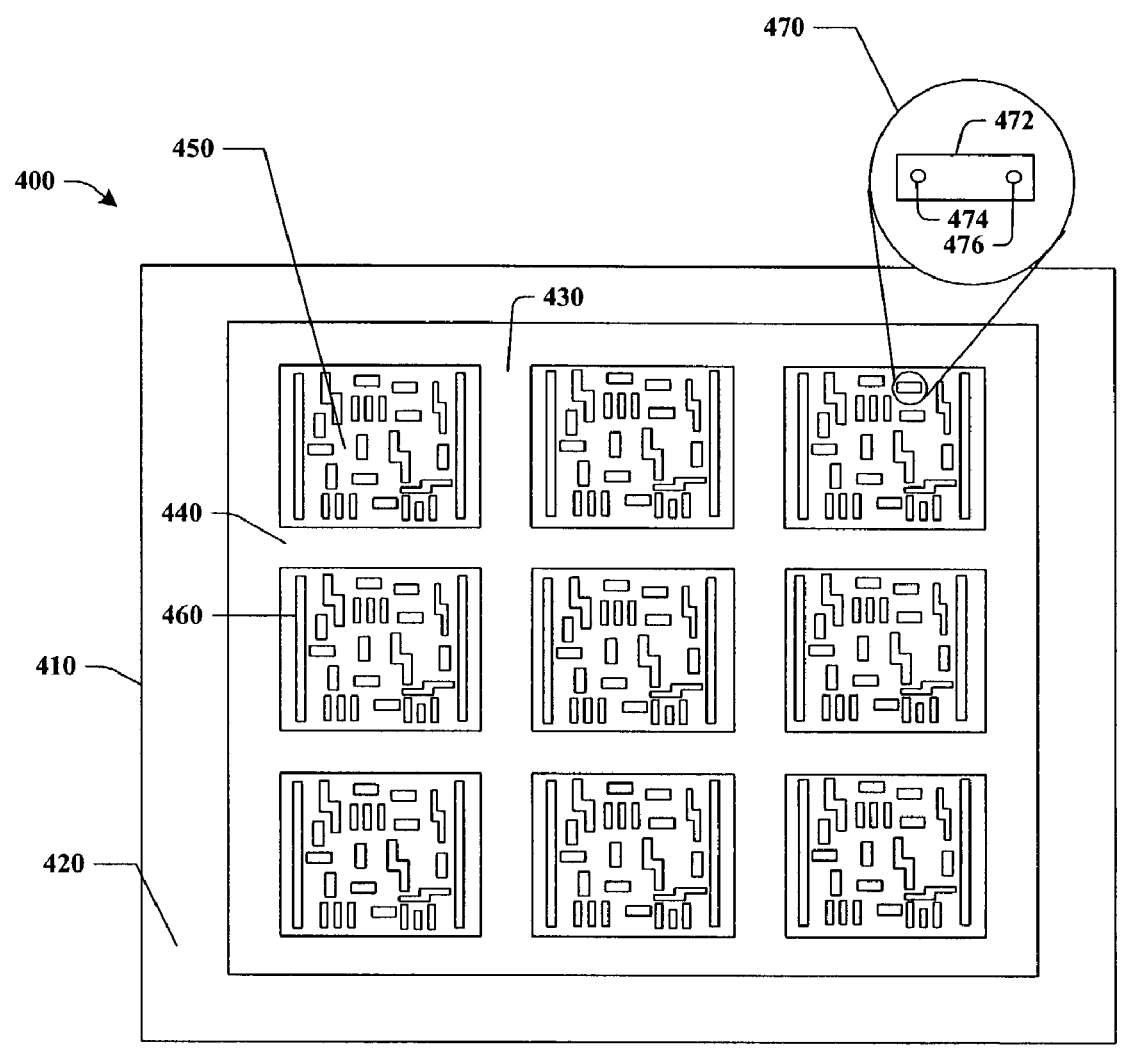
FIG. 17 is an illustration of a reticle where features within the actual device feature areas are utilized as test features to determine critical dimensions and/or defects in a reticle in accordance with an aspect of the present invention.

FIG. 17 illustrates yet another aspect of the invention. In accordance with the present invention, probe points may be included on one or more metal lines that form the integrated circuit features within the device feature areas of the reticle. By utilizing such probe points, the metal lines of the device area function as test features from which the reticle critical dimensions are directly evaluated. Certain defects can also be detected. In FIG. 17, reticle 400 has substrate 410 and metal layer 420. Vertical scribe lines 430 and horizontal scribe lines 440 separate device feature areas 450 from each other. Within each device feature area 450, identical metal lines 460 exist. 470 is an enlargement of a typical metal line 472 that forms a part of one of the identical device feature areas 450. In accordance with one aspect of the invention, metal line 472 is fabricated with probe points 474 and 476 as part of the device feature area. Metal line 472 functions as a test feature. Accordingly, a reticle test system may be employed to check for defects and/or to evaluate the critical dimensions of the reticle at or near metal line 472. It is to be understood that probe points may be employed on one or more of the metal lines within the device feature area. Furthermore, the probe points may be included as part of one or more metal lines within one or more device feature areas within the reticle.

Figure 18:
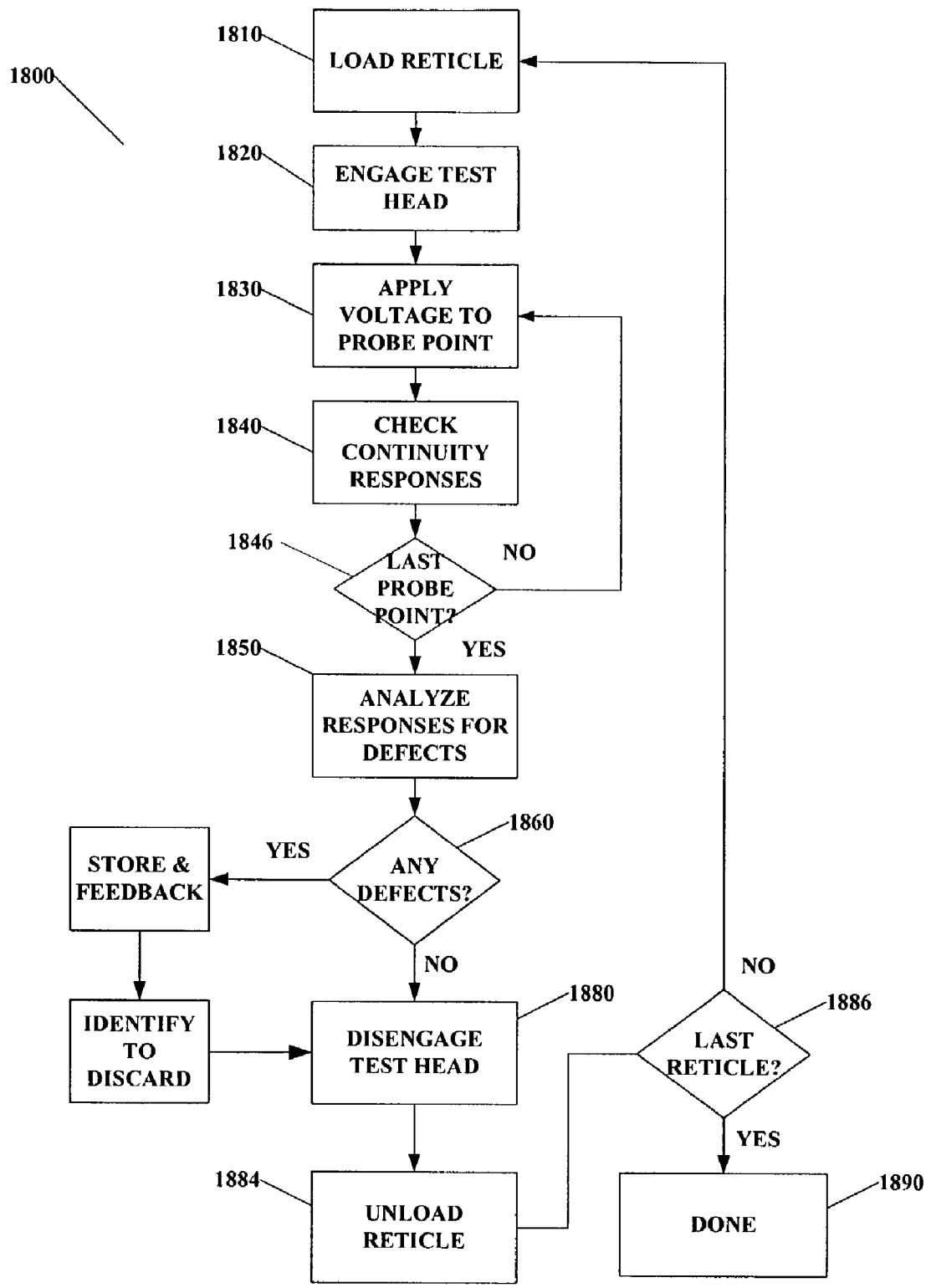
FIG. 18 is a flow diagram illustrating a methodology for determining defects in a reticle in accordance with an aspect of the present invention.

FIG. 18 is a flow diagram illustrating a methodology 1800 for checking for defects in a reticle in accordance with the present invention. The methodology 1800 begins at 1810 where a complete reticle is loaded by the load system into the reticle carrier. The positioning system then properly positions the reticle so that the test head is engaged at 1820. At 1830, voltage is applied by the test head to a probe point of the reticle. The probe point may be one of the probe points of a test feature within a test structure of the reticle or one of the probe points of a test feature with the device feature areas of the reticle. At 1840 the test head checks for electrical continuity responses at all other probe points within the reticle. At 1846, determination is made as to whether the last probe point has been evaluated. If not, the process returns to 1830 to apply a voltage to the next probe point, otherwise the process proceeds to 1850.

At 1850 the processor analyzes the applied voltages and recorded electrical continuity responses. At 1860, determination is made on whether a defect exists. If a defect does exist, then at 1870 the information as to the type of defect and the location of the defect can be stored in memory and/or fed forward or backward for use in the reticle fabrication process of the current or subsequent reticles. At 1874, the defective reticle is identified to be discarded, then the test head is disengaged at 1880. Returning to 1860, if no defects are found, the test head is disengaged at 1880. At 1884, the reticle is unloaded and at 1886, determination is made as to whether the last reticle has been tested. If the last reticle has been tested, then the process is done at 1890, if not, the process returns to 1810 to load a new reticle and the process continues until the last reticle has been tested.

Figure 19:
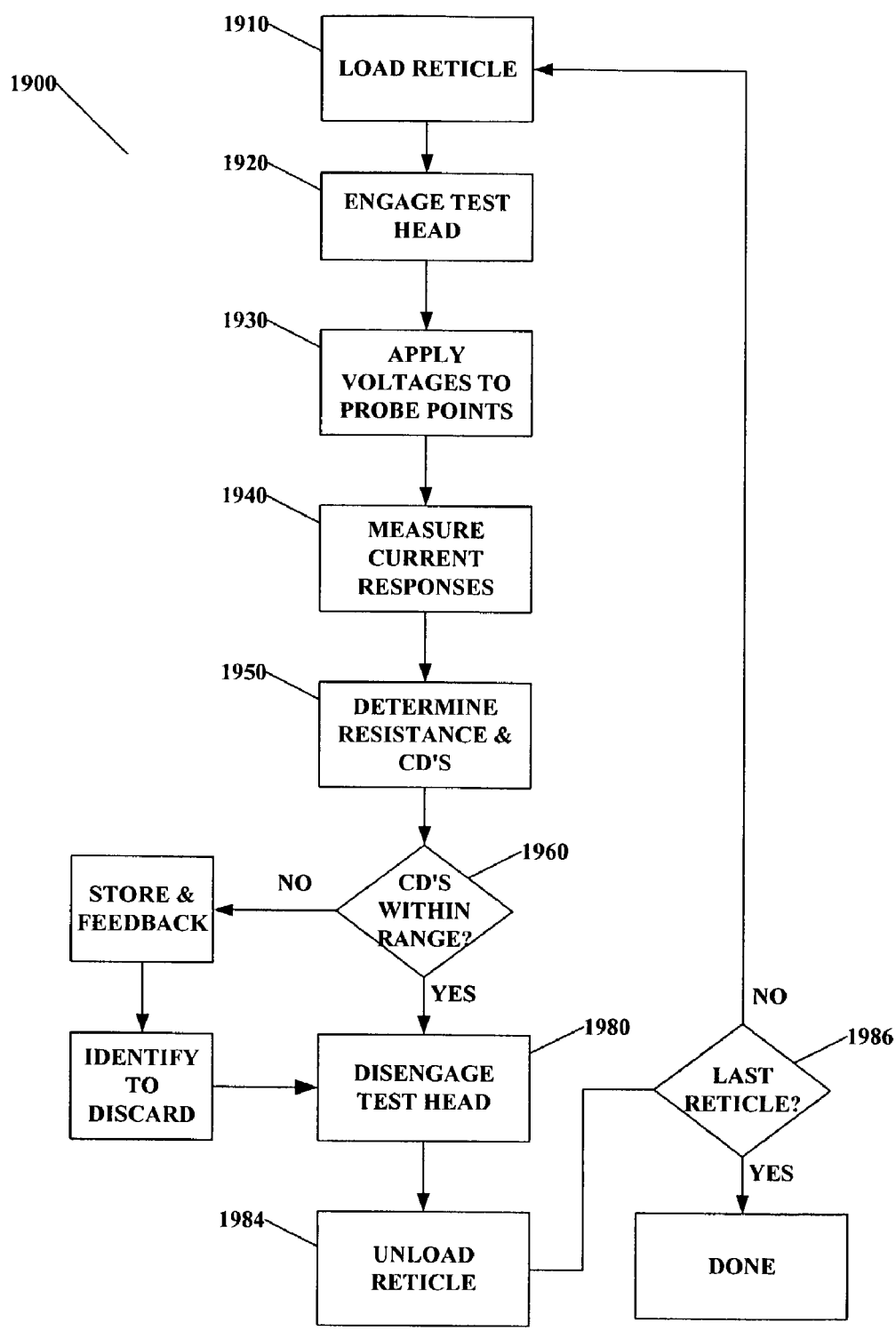
FIG. 19 is a flow diagram illustrating a methodology for determining critical dimensions in a reticle in accordance with an aspect of the present invention.

FIG. 19 is a flow diagram illustrating a methodology that may be employed for measuring critical dimensions of a reticle in accordance with the present invention. The methodology 1900 begins at 1910 where a complete reticle is loaded by the load system into the reticle carrier. The positioning system then properly positions the reticle so that the test head may be engaged at 1920. At 1930, a voltage is applied by the test head to the probe points of the reticle. The probe points may be the probe points of a test feature within a test structure of the reticle, or probe points on test features within the device feature area of the reticle, or both. At 1940 the test head measures the current in responses to the voltage applied to the various probe points. At 1950 the processor analyzes the applied voltages and resulting currents and determines the resistance values and critical dimensions of each feature tested. At 1960, determination is made as to whether the critical dimensions are within the desired limits. If the critical dimensions are not within the desired limits, then at 1970 the information can be stored in memory and/or fed forward or backward for use in the fabrication process of the current or subsequent reticles. At 1974, the defective reticle is identified to be discarded, then the test head is disengaged at 1980. Returning to 1960, if the critical dimensions are within the desired limits, then the test head is disengaged at 1980. At 1984, the reticle is unloaded and at 1986, determination is made as to whether the last reticle has been tested. If the last reticle has been tested, then the process is done at 1990, if not, the process returns to 1910 to load a new reticle and the process continues until the last reticle has been tested.

It should be understood that the two methodologies discussed in FIG. 18 and FIG. 19 are merely illustrative of numerous methodologies that could be used to employ the present invention. It should also be understood that the two methods may be used in conjunction with each other to simultaneously look for defects and determine the critical dimensions of the reticle.

What has been described above are preferred aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A reticle comprising:
   a patterned metal layer over a translucent substrate;
   at least one test feature wherein the test feature comprises a metal line and two probe points operable for making electrical contact;
   a digital signature utilizing at least one of a short and an open to represent a test structure;
   a plurality of device feature areas;
   one or more scribe lines separating the device feature areas from each other; and
   at least one test structure comprising the test feature.

2. The reticle of claim 1 wherein the test feature comprises a single open wherein the open has a discontinuity positioned in close proximity to a probe point.

3. The reticle of claim 1 comprising silica glass or fused quartz.

4. The reticle of claim 3 wherein the test structure comprises two test features, and the test features comprise two shorts oriented as substantially parallel lines and positioned to replicate the closest spacing between features within the device feature area.

5. The reticle of claim 3 wherein the test structure comprises two test features, and the test features comprise one short and one open oriented as substantially parallel lines and positioned to replicate the closest spacing between features within the device feature area.

6. The reticle of claim 3 wherein the test feature comprises a single open wherein the open has a discontinuity positioned in close proximity to a probe point.

7. The reticle of claim 3 further comprising a test structure wherein the test structure comprises at least two test features, wherein the test features comprise at least one short and at least one open.

8. The reticle of claim 3 wherein at least one of the test structures is located within one of the scribe lines.

9. The reticle of claim 3 wherein at least one of the test structures is located within one of the device feature areas.

10. The reticle of claim 1 wherein the test feature comprises a single short.

11. The reticle of claim 1 further comprising a test structure wherein the test structure comprises at least two test features, wherein the test features comprise two or more shorts wherein each short is a progressively longer line.

12. The reticle of claim 1 further comprising a test structure wherein the test structure comprises at least two test features, wherein the test features comprise two or more opens wherein each open has a discontinuity, the size of the discontinuity being progressively smaller from one open to the next.

13. The reticle of claim 1 further comprising a test structure wherein the test structure comprises at least two test features, wherein the test features comprise two or more shorts, each short comprising a 90 degree corner.

14. A system for evaluating a reticle comprising:
   a reticle comprising at least one a test feature and at least one test structure, the test feature comprising a metal line and at least two probe points, and a digital signature that utilizes at least one of an open and a short to represent a test structure, the test structure comprising the test feature, the reticle further comprises a plurality of device feature areas and one or more scribe lines separating the device feature areas from each other, and wherein at least one test structure is positioned within the scribe lines; and
   a reticle test system operable to apply a voltage across the probe points of the test feature, measure a resulting current in the test feature, calculate a corresponding resistance of the test feature, and determine the critical dimensions associated with the test feature based at least in part on the corresponding resistance.

15. The system of claim 14 wherein the test feature comprises a single short.

16. The system of claim 14 wherein the test feature comprises a single open wherein the open has a discontinuity positioned in close proximity to a probe point.

17. The system of claim 14 wherein the reticle further comprises a plurality of device feature areas and scribe lines separating the device feature areas from each other, and wherein at least one test structure is positioned in at least one device feature area.

18. The system of claim 14 wherein the reticle test system is further operable to determine whether electrical continuity exists between any pair of probe points and determine defects based at least in part on the electrical continuity determination.

19. The system of claim 18 wherein the reticle further comprises at least one test structure, the test structure comprising the test feature.

20. The system of claim 19 wherein the reticle further comprises a plurality of device feature areas and one or more scribe lines separating the device feature areas from each other, and wherein at least one test structure is positioned within the scribe lines.

21. The system of claim 19 wherein the reticle further comprises a plurality of device feature areas and scribe lines separating the device feature areas from each other, and wherein at least one test structure is positioned in at least one device feature area.

22. A method for evaluating reticles comprising:
   applying a voltage across a first probe point and a second probe point of a test feature within a device feature area on a reticle;
   creating a digital signature with at least one of a short and an open;
   measuring a resulting current;
   calculating a resistance value for the test feature based on the voltage applied and the resulting current; and
   determining the critical dimensions of the test feature based at least in part on the resistance value.

23. The method of claim 22, further comprising analyzing the critical dimensions and altering the fabrication of subsequent reticles.

24. A method for evaluating a reticle, comprising:
applying a voltage across a first probe point and a second probe point of a test feature within a device feature area on a reticle;
determining whether electrical continuity exists between the first probe point and the second probe point of the test feature;
determining whether electrical continuity exists between the first probe point and any other probe points within the reticle;
repeating the above steps for all probe points within the reticle; and
determining whether a defect exists based at least in part on the determined electrical continuity results.

25. The method of claim 24 further comprising analyzing the determination of whether a defect exists and altering the fabrication of subsequent reticles.

* * * * *